US 009390804B2

(12) United States Patent
Van Keer et al.

(10) Patent No.: US 9,390,804 B2
(45) Date of Patent: Jul. 12, 2016

(54) FLASH MEMORY COUNTER

(71) Applicant: Proton World International N.V., Zaventem (BE)

(72) Inventors: Ronny Van Keer, Hoeilaart (BE); Youssef Ahssini, Vilvoorde (BE)

(73) Assignee: PROTON WORLD INTERNATIONAL N.V., Diegem (BE)

( * ) Notice: Subject to any disclaimer, the term of this patent is extended or adjusted under 35 U.S.C. 154(b) by 0 days.

(21) Appl. No.: 14/522,007

(22) Filed: Oct. 23, 2014

(65) Prior Publication Data

US 2015/0117106 A1 Apr. 30, 2015

(30) Foreign Application Priority Data

Oct. 25, 2013 (FR) ..................................... 13 60440

(51) Int. Cl.
*G11C 11/34* (2006.01)
*G11C 16/14* (2006.01)
*G06F 12/02* (2006.01)
*G11C 16/34* (2006.01)

(52) U.S. Cl.
CPC ............ *G11C 16/14* (2013.01); *G06F 12/0246* (2013.01); *G11C 16/345* (2013.01)

(58) Field of Classification Search
CPC .................. G11C 16/14; G11C 16/08

USPC ................... 365/185.17, 185.12, 185.29
See application file for complete search history.

(56) References Cited

U.S. PATENT DOCUMENTS

| 7,616,508 B1 * | 11/2009 | Landry ............ H03K 19/17768 365/189.15 |
| 2009/0259877 A1 | 10/2009 | Vyssotski et al. |
| 2011/0292734 A1 * | 12/2011 | Kim .................... G11C 11/5628 365/185.19 |
| 2014/0362640 A1 * | 12/2014 | Tailliet .................... G11C 16/14 365/185.12 |

FOREIGN PATENT DOCUMENTS

KR 10-2008-0064476 A 7/2008

OTHER PUBLICATIONS

French Search Report dated May 20, 2014, for French Application No. FR1360440, 6 pages.

* cited by examiner

*Primary Examiner* — Han Yang
(74) *Attorney, Agent, or Firm* — Seed IP Law Group PLLC

(57) ABSTRACT

A method of updating a counter in a flash memory includes a first phase where a set of values capable of being taken by the counter are programmed in at least one page of the flash memory. A second phase of updating the counter programs a state zero in the flash memory each time the counter is incremented/decremented.

20 Claims, 2 Drawing Sheets

ND  FLASH MEMORY COUNTER

CROSS-REFERENCE(S) TO RELATED
APPLICATION(S)

This application claims the priority benefit of French Patent application number 13/60440, filed on Oct. 25, 2013, the content of which is hereby incorporated by reference in its entirety.

BACKGROUND

1. Technical Field

The present disclosure generally relates to electronic circuits and, more specifically, to circuits using a flash memory. The present disclosure more specifically relates to the forming of a counter having its value stored in a flash memory.

2. Description of the Related Art

In many applications, the result of a counter needs to be non-volatilely stored so that it is conserved independently from the circuit power supply. Such is particularly the case in microcircuit cards which integrate a microprocessor and at least one non-volatile memory, and more generally in any electronic circuit requiring non-volatile memory counting elements.

Up to now, EEPROM-type memories are used to store the value of a counter.

BRIEF SUMMARY

Due to the development of flash-type memories, it would be desirable to be able to use such memories to store the values of counters.

However, a constraint is that flash-type memories can only be erased in full memory pages.

Thus, an embodiment aims at a method of updating a counter in a flash memory, comprising:
a first phase where a set of values capable of being taken by the counter are programmed in at least one page of the flash memory; and
a second phase where, each time the counter is incremented/decremented, the current value is programmed to state zero in the flash memory.

According to an embodiment, the first phase comprises:
erasing the page from the memory; and
writing, in a single operation, successive values of the counter in the page.

According to an embodiment, a reading of the counter value comprises sequentially examining the page content and considering the first non-zero value.

According to an embodiment, a page comprises 64, 128, or 256 bytes.

According to an embodiment, a flash memory programmed according to the above method is also provided.

According to an embodiment, an electronic circuit comprising such a flash memory is also provided.

The foregoing and other features and advantages will be discussed in detail in the following non-limiting description of specific embodiments in connection with the accompanying drawings.

BRIEF DESCRIPTION OF THE SEVERAL
VIEWS OF THE DRAWINGS

FIG. 1 is a block diagram of an example of electronic circuit of the type to which the embodiments which will be described apply;

FIG. 2 very schematically illustrates in the form of blocks an example of a system using a near-field communication (NFC) router;

DETAILED DESCRIPTION

Figure 1:
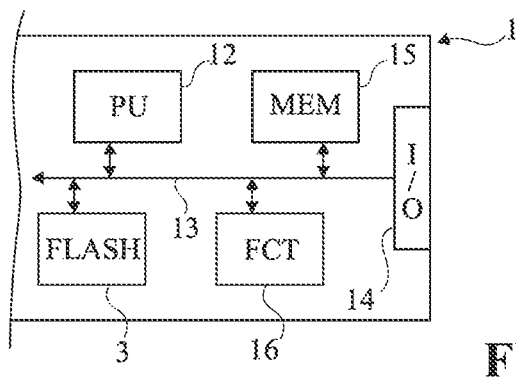

The same elements have been designated with the same reference numerals in the different drawings. For clarity, only those acts and elements which are useful to the understanding of the embodiments which will be described have been shown and will be detailed. In particular, the electric behavior of a flash memory during write, read, and erase has not been detailed, the described embodiments being compatible with usual flash memory technologies. Further, applications using the updating of a counter to be stored in a flash memory have not been detailed either, the described embodiments being here again compatible with usual applications.

Using a flash memory to store a counter raises a plurality of issues relative to the current use of an EEPROM.

Conventionally, when a counter is stored in an EEPROM, the programming and the erasing are performed on bytes or on words in the memory, which provides enough granularity.

A flash memory is programmed from an initial state to states 0 (non-conductive states of the cells). This means that the memory cells should be set to a high state and that, to store a piece of data, it is chosen either not to act on the bit state, or to program this bit to 0.

Further, an erasing (setting back to the initial state) is necessarily performed on a whole memory page. A page is defined as being the minimum size capable of being simultaneously addressed to be erased. In practice, this corresponds to the size of a register receiving the data in series to transfer them in parallel to the memory plane for storage. Typically, a page currently amounts, in a flash memory, to 32, 64, 128, 256, or 512 bytes.

Now, a counter requires switching the state of a single bit (or of a few bits, according to the increment/decrement).

The page erasing operation is relatively long (typically in the order of a few milliseconds) with respect to a byte programming operation (typically in the order of some ten microseconds).

A process comprising erasing the page to program the new counter state for each increment would take too much time. In particular, in many applications, the time available to write into the non-volatile memory is limited. This is particularly true in applications using a contactless near-field communication technology (NFC) since the duration of the transaction between two communicating elements is only temporary and risks being interrupted at any time. Now, the use of a counter in a non-volatile memory is, in such applications, often in relation with safety issues in terms of access to certain data. The reliability of the counter is then critical. So-called atomic procedures may then have to be implemented to improve the reliability. However, such procedures further increase the need to update data in the non-volatile memory.

FIG. 1 schematically shows, in the form of blocks, an example of an electronic circuit 1 of the type to which the embodiments which will be described apply. Such a circuit comprises a processing unit 12 (PU) capable of communicating, via one or a plurality of data, address, and control buses 13, with different elements including, for example, an input/output interface 14 (I/O) of communication with the outside of circuit 1, one or a plurality of volatile or non-volatile memories 15 (MEM), one or a plurality of functions (symbolized by a block 16, FCT) associated with the application, and at least one flash memory 3 (FLASH). Other elements are capable of being connected to buses 13 and/or of being comprised in the circuit. The flash memory may be external to circuit 1.

Figure 2:
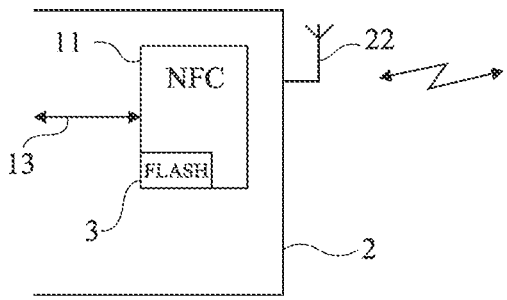

FIG. 2 is a simplified representation of an example of a device 2 comprising one or a plurality of electronic circuits 11 forming a near-field communication router (NFC) capable of communicating via different buses 13 with the rest of device 2. The NFC router is used as an interface between the different elements of device 2 and an antenna 22 of near-field communication with a neighboring device, not shown. In the example of FIG. 2, the NFC circuit comprises at least one flash memory 3.

The applications targeted by the present disclosure use at least one counter having its value stored in the flash memory.

Figure 3:
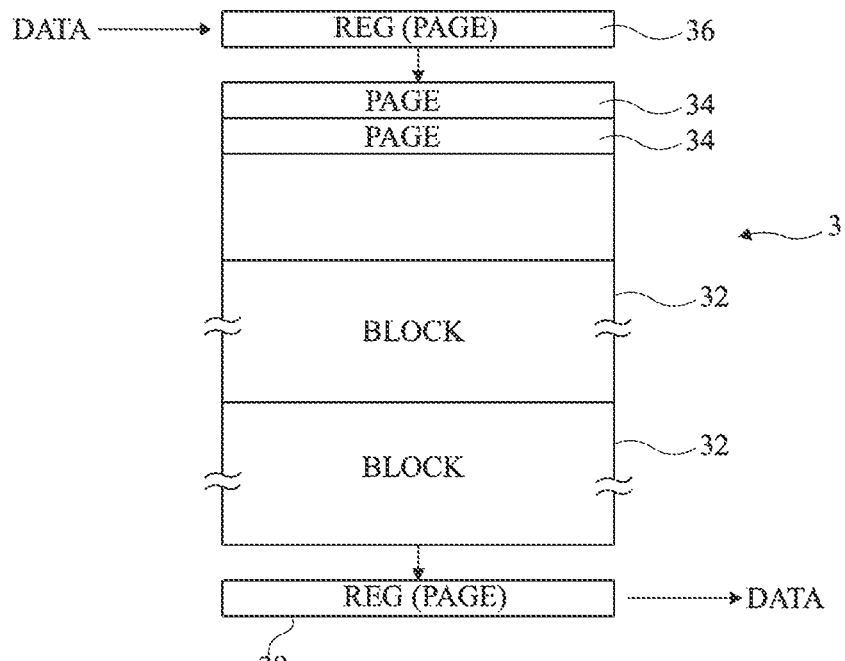
FIG. 3 is a simplified representation of an example of flash memory.

FIG. 3 very schematically illustrates an example of architecture of a flash memory 3, such a memory being generally organized in blocks 32 (BLOCK) each comprising a plurality of pages 34 (PAGE), each having a given number of bytes, for example, 512, 1,024, or 2,048 bytes. The writing of data DATA into memory 3 or the erasing are performed via an input register 36 (REG). The data are typically sent in a series communication, or in bytes, into write register 36, which is then discharged in parallel towards a block of the memory. In read mode, the addressing of an area also results in the reading of a page through an output register 38 which outputs the read data.

The representation of FIG. 3 is simplified and the different control and addressing circuits have not been illustrated.

The normal use of a flash memory to store data having a size smaller than one page would take too much time. Indeed, for each new value to be stored in the counter, it would be necessary to erase the entire page to be able to reprogram a new value.

In a counter initialization phase, an entire memory page is erased, after which all the expected values of the counter capable of being stored in this page are programmed. Once this page initialization is over, for each increment or decrement of the counter, the corresponding value in the page is programmed to zero. In read mode, the current value of the counter is given by the first addressed value (typically in the sequential order) which is not zero.

Figure 4:
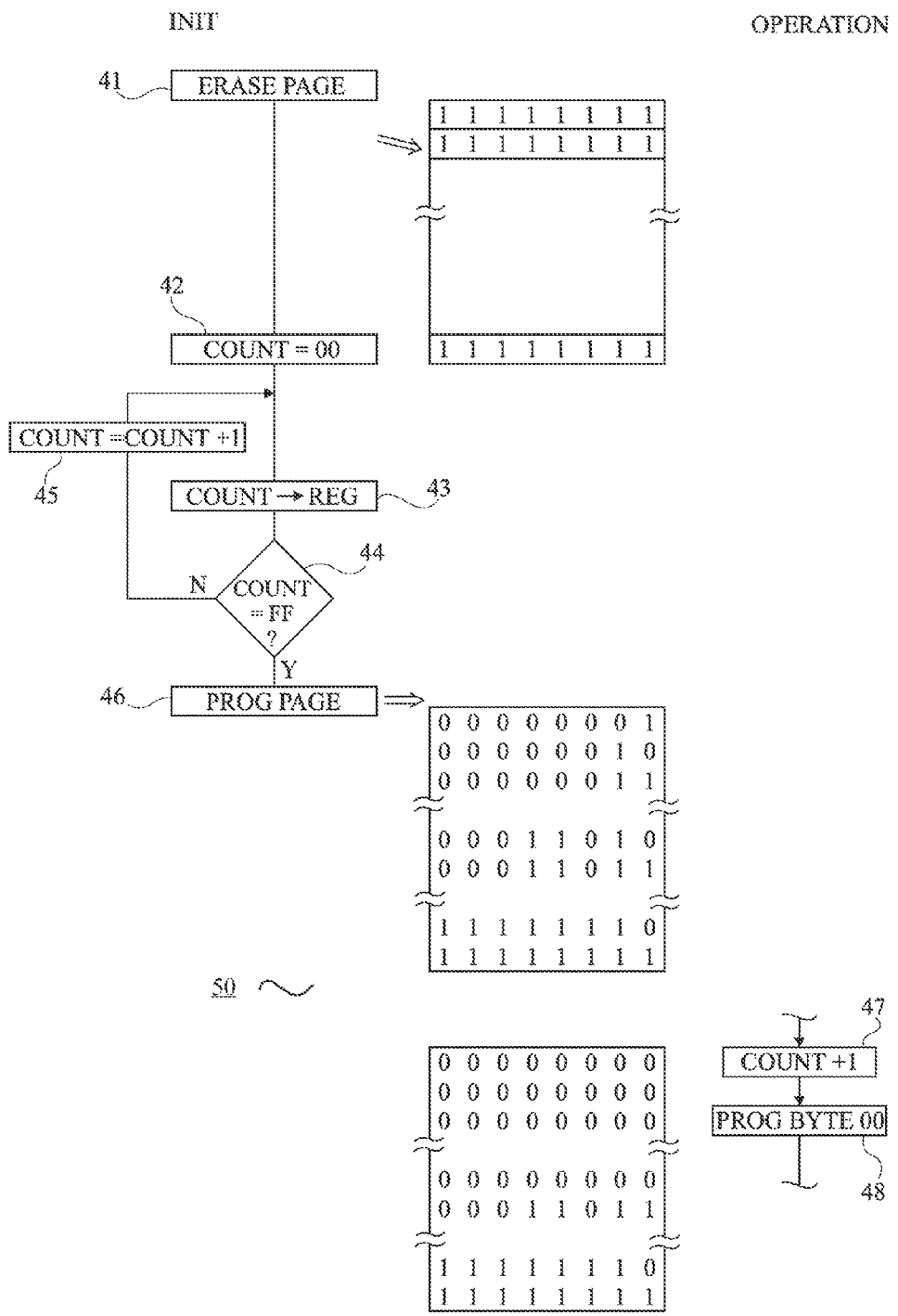
FIG. 4 illustrates an embodiment of the method of programming a counter in a flash memory.

FIG. 4 very schematically illustrates an embodiment of a method of updating a counter in a flash memory.

In a counter initialization phase (INIT), it is started by erasing (block 41, ERASE PAGE) the corresponding page in the memory, that is, by setting all the bits in the page to a state 1 (byte at value FF). Then, in a second act of the initialization phase, all the successive counter values are written in a single operation into the memory page. For example, the different values are generated in the RAM or in registers by successive increments or decrements of all the counter values. This act is illustrated in FIG. 4 by a block 42 (COUNT=00) of initialization of the counter value to 0 (byte at 00), and then by a loop (blocks 42 to 46) where the current value is stored (block 43, COUNT→REG) in a register preferably having the size of a page of the flash memory, a test (block 44, COUNT=FF?) being then performed to determine whether the maximum value of the counter has been reached. As long as all the values have not been calculated (output N of test 44), the counter is incremented (block 45, COUNT=COUNT+1). Once all values are present in the register (output Y of test 44), the content thereof is programmed in the flash memory page.

An example of page content is illustrated in the central portion 50 of FIG. 4.

These two operations take time but are to be performed only once for a counter corresponding to the capacity of a page.

During the counter operation (OPERATION), that is, its use by circuits 1 and 11 and more particularly during an increment thereof (block 47, COUNT+1), a programming (block 48, PROG BYTE 00) of the bits of the byte corresponding to value 0 (byte at value 00) is performed. Such a programming is performed rapidly in a flash memory, conversely to the erasing, since it is performed in bytes. In the example of FIG. 4, the current value is assumed to be 00011010. As illustrated in the central portion 50 of FIG. 4, this byte, as well as all the previous bytes through which the counter values have passed) then are at 0.

The initialization phase may be implemented each time the counter is needed to be reset.

For example, by using a counter over one byte (8 bits), a page of 256 flash memory bytes contains all the possible values of the counter.

In the case where the counter is over a larger number than contained in a byte, it is sufficient to use a plurality of pages and to concatenate the read values.

An advantage of the described embodiments is that they make the use of a flash memory possible to store the value of a counter.

Another advantage is that the counter update is fast, particularly as compared with the time required to erase a page from the flash memory.

Various embodiments have been described. Various alterations, modifications, and improvements will readily occur to those skilled in the art. In particular, the practical implementation of the described embodiments is within the abilities of those skilled in the art based on the functional indications given hereabove and by using circuits usual per se.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method to update a counter in a flash memory, comprising:
   providing a counter in the flash memory, the counter arranged to count from an initial value to a final value, wherein the initial value, the final value, and each successive value between the initial value and the final value form a set of values capable of being taken by the counter, and wherein each value in the set of values is a different value;
programming the set of values in at least one page of the flash memory; and
updating the counter from a current value to a next value includes programming a state zero in the flash memory at a location represented by the current value.

2. The method of claim 1, wherein programming the set of values comprises:
erasing the at least one page from the memory; and
writing, in a single operation, successive values of the counter in the at least one page.

3. The method of claim 1, comprising:
reading the counter, wherein the reading includes sequentially examining values stored on the at least one page and returning a first non-zero value.

4. The method of claim 1, wherein one page of the memory comprises 64, 128, or 256 bytes.

5. The method of claim 1, wherein each sequential address of the at least one page of memory is programmed with a sequentially larger value.

6. The method of claim 1, wherein each sequential address of the at least one page of memory is programmed with a sequentially smaller value.

7. The method of claim 1, wherein the set of values includes integers stored in ascending order.

8. The method of claim 1, wherein the set of values includes integers stored in descending order.

9. The method of claim 1, comprising:
rolling over the counter, the rolling over including erasing the at least one page of the flash memory.

10. A device, comprising:
a processing unit;
a flash memory;
counter logic including at least one register, the counter logic configured to sequentially count from an initial value to a final value, wherein the initial value, the final value, and each successive value between the initial value and the final value form a set of integers capable of being taken by the counter, and wherein each value in the set of values is a different value; and
a memory having instructions stored therein, the instructions executable by the processing unit, the instructions arranged to initialize the counter logic by storing the set of integers between the initial value and the final value inclusive in the flash memory, the instructions arranged to retrieve a current counter value.

11. The device of claim 10, wherein the set of integers includes all integers beginning at the initial value and ascending to the final value.

12. The device of claim 10, wherein the set of integers includes all integers beginning at the initial value and descending to the final value.

13. The device of claim 10, wherein retrieving the current counter value includes identifying a first sequential location in the flash memory that does not have a clearing value and wherein the instructions are arranged to update the current counter value by writing the clearing value in the flash memory at a next sequential location after the first sequential location in the flash memory that does not have the clearing value.

14. The device of claim 10, wherein the set of integers are stored on at least one dedicated page of the flash memory.

15. The device of claim 10, wherein the device is formed as part of a microcircuit card.

16. A method, comprising:
initializing an N-bit counter, the N-bit counter arranged to take on one value of M different values at any given time, the initializing including loading a dedicated area of a flash memory with each one of the M different values:
updating a current counter value of the N-bit counter, the updating including:
reading data from sequential addresses in the dedicated area of the flash memory until an address is found where the data at the address found is not equal to a clearing value;
setting the current counter value to the data at the address found that is not equal to the clearing value; and
storing the clearing value at the address found in the dedicated area of the flash memory where the data is not equal to the clearing value.

17. The method of claim 16, wherein M is at least $(2^N-1)$.

18. The method of claim 16, wherein the initializing includes erasing at least one page of the flash memory.

19. The method of claim 16, comprising:
performing a near-field communications (NFC) transaction.

20. The method of claim 16, wherein updating the current counter value includes incrementing the N-bit counter.

* * * * *